US006952003B2

(12) United States Patent
Skurnik et al.

(10) Patent No.: US 6,952,003 B2
(45) Date of Patent: *Oct. 4, 2005

(54) VERY HIGH SPEED PHOTODETECTOR SYSTEM USING A PIN PHOTODIODE ARRAY FOR POSITION SENSING

(75) Inventors: David Skurnik, Kirkland, WA (US); Randall Brian Sprague, Carnation, WA (US); Geoffrey Hugh Jones, Seattle, WA (US); Eric Charles Abbott, North Bend, WA (US); Waisiu Law, Duvall, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/913,974

(22) Filed: Aug. 5, 2004

(65) Prior Publication Data

US 2005/0006564 A1 Jan. 13, 2005

Related U.S. Application Data

(63) Continuation of application No. 10/163,204, filed on Jun. 4, 2002, now Pat. No. 6,831,263.

(51) Int. Cl.[7] .................................................. G01J 1/42

(52) U.S. Cl. ............................... 250/208.2; 250/206.1; 257/458

(58) Field of Search ........................... 250/208.2, 206.1, 250/214 R; 327/514; 356/213, 218; 257/443, 458

(56) References Cited

U.S. PATENT DOCUMENTS 3,918,814 A 11/1975 Weiser
4,275,965 A 6/1981 Snitzer et al.
4,515,479 A 5/1985 Pryor
5,017,771 A 5/1991 Bartholomew et al.
5,042,905 A 8/1991 Anjan et al.
5,168,528 A 12/1992 Field, Jr.
5,272,517 A 12/1993 Tokura
5,331,149 A 7/1994 Spitzer et al.

(Continued)

OTHER PUBLICATIONS

Makynen, A., et al., “Linear and Sensitive CMOS Position–Sensitive Photodetector,” Electronic Letters, vol. 34, No. 12, pp. 1255–56 (Jun. 11, 1998).

(Continued)

*Primary Examiner*—David Porta
*Assistant Examiner*—Patrick J. Lee
(74) *Attorney, Agent, or Firm*—Blakely, Sokoloff, Taylor & Zafman LLP

(57) ABSTRACT

An apparatus for detecting a centroid of a spot produced by electromagnetic radiation, e.g., optic radiation, using an array of PIN photodiodes serving as photodetectors and being organized in columns and in rows. Vertical connections are used to interconnect the PIN photodiodes in the columns in accordance with a first pattern that interconnects two or more adjacent columns. Horizontal connections are used to interconnect PIN photodiodes in the rows in accordance with a second pattern that interconnects two or more adjacent rows. The first and second patterns of interconnections can include just two adjacent columns and two adjacent rows, respectively and form a checkerboard interconnect pattern. The interconnections are made such that there are no anode connections between the PIN photodiodes in the rows and columns. The apparatus has a processing circuitry for rapidly deriving an X-extent of the centroid from current signals obtained from the columns and a Y-extent of the centroid from current signals obtained from the rows.

14 Claims, 11 Drawing Sheets

U.S. PATENT DOCUMENTS

| | | | | |
|---|---|---|---|---|
| 5,355,013 | A | 10/1994 | Parker | |
| 5,436,458 | A | 7/1995 | Tran et al. | |
| 5,446,424 | A | 8/1995 | Pierro | |
| 5,483,060 | A | 1/1996 | Sugiura et al. | |
| 5,498,867 | A | 3/1996 | Senuma et al. | |
| 5,536,964 | A | 7/1996 | Green et al. | |
| 5,557,347 | A | 9/1996 | Johnson | |
| 5,670,774 | A | 9/1997 | Hill | |
| 5,825,481 | A | 10/1998 | Alofs et al. | |
| 5,837,995 | A | 11/1998 | Chow et al. | |
| 5,880,459 | A | 3/1999 | Pryor et al. | |
| 5,880,461 | A | 3/1999 | Spear | |
| 5,929,980 | A | 7/1999 | Yamaguchi et al. | |
| 6,211,506 | B1 | 4/2001 | Pryor et al. | |
| 6,297,488 | B1 | 10/2001 | Beraldin et al. | |
| 6,332,015 | B1 | 12/2001 | Honda | |
| 6,344,370 | B1 | 2/2002 | Izumi et al. | |
| 6,831,263 | B2 * | 12/2004 | Skurnik et al. | 250/208.2 |

OTHER PUBLICATIONS

Makynen, A., et al., "High accuracy CMOS Position–Sensitive Photodetector (PSD)," Electronic Letters, vol. 33, No. 2, pp. 128–130, (Jan. 16, 1997).

Delimamonteiro, W., et al., "Various Layouts of Analog CMOS Optical Position–Sensitive Detectors," SPIE Conference on Electronics for Solid State Sensors, SPIE vol. 3794, pp. 134, (Jul. 1999).

Blais, F., et al., "Real–Time Numerical Peak Detector," Signal Processing, vol. 11, No. 2, pp. 145–155 (1986).

Shapiro, S.–L, et al., "Silicon PIN Diode Array Hybrids for Charged Particle Detection," DPF Summer Study: Snowmass '88, High Energy Physics in the 1990's Snowmass, Colorado, (Jun. 27–Jul. 15, 1988), pp. 1–6.

PerkinElmer Optoelectronics, PerkinElmer Optoelectronics Introduces Higher Resolution Multiplexed InGaAs PIN Photodiode Array<http://www.photonics.com/Spectra/News/mar01/newsPerkinelmer3.html [retrieved from the Internet, Mar. 6, 2002].

Detection Technology, High Performance Silicon PIN Photodiodes and Radiation Detectors, http://www.deetee.com/entranceA.html [retrieved from the Internet, Mar. 6, 2002].

* cited by examiner

VERY HIGH SPEED PHOTODETECTOR SYSTEM USING A PIN PHOTODIODE ARRAY FOR POSITION SENSING

This is a Continuation of U.S. application Ser. No. 10/163,204, filed Jun. 4, 2002, now U.S. Pat. No. 6,831,263.

FIELD OF THE INVENTION

The present invention relates to an apparatus and method employing a checkered photodetector array employing PIN photodiodes for detecting the location of a centroid of a spot produced by impinging electromagnetic radiation.

BACKGROUND

Optical sensing techniques are used to determine the position, dimensions, attitude and angular displacement of a moving object. They are also used to track and/or sense the motion of a mechanical part belonging to a larger system or perform other position measurements requiring high levels of accuracy. Among other, these techniques find-numerous applications in the fields of robotics, artificial vision, mechanical control and feedback. For an example of a prior art method and apparatus for electro-optically determining the dimension, location and attitude of objects the reader is referred to U.S. Pat. No. 6,211,506 to Pryor et al.

Most of the sensing techniques use a coherent radiation source to generate a beam of electromagnetic radiation in a wavelength range suitable for the particular environment and application. For example, the source can be a laser delivering a beam of light in the visible wavelength range. The light beam is reflected from the object whose position is to be sensed to a position sensitive photodetector (PSD). The reflected light impinges on the PSD and produces a spot whose two-dimensional extent is analyzed to find the centroid.

Locating the centroid of a light spot presents a number of challenges due to ever-increasing requirements for high sensitivity, high resolution, linearity of response, immunity to stray light and speed. PSDs are generally divided into two groups: continuous response position sensitive detectors (CRPSD) and discrete response position sensitive detectors (DRPSD). A CRPSD is a detector that determines/calculates the centroid of a light distribution that may include stray light components in addition to a desired light spot. A DRPSD is a detector that samples and analyzes the entire light distribution to determine the position of the desired light spot within the light distribution.

CRPSDs typically use lateral effect photodiodes (LEPS) and geometrically shaped photo-diodes (wedges or segmented) such as described by A. Makynen and J. Kostamovaara, "Linear and sensitive CMOS position-sensitive photodetector", Electronics Letters, Vol. 34, No. 12, pp. 1255–56 (11 Jun., 1998) and in A. Makynen et al., "High accuracy CMOS position-sensitive photodetector (PSD)", Electronics Letters, Vol. 33, No. 2, pp. 128–130 (16 Jan., 1997). The first of these references takes note of the nonlinearity and high noise suffered by LEPs in practical applications despite their large-area continuous construction and proposes a CMOS-compatible PDS using phototransistors to achieve higher resolution, accuracy and linearity. The phototransistors are small-sized and arranged to form a dimensionally accurate array, in which the emitters of every other phototransistors in each row are connected to the row current line and every other to the column current line. The photocurrents are processed using two separate arrays of polysilicon resistors with homogenous resistivity. The use of such array of phototransistors improves resolution in comparison to a conventional LEP and achieves good linearity. The second of these references describes further improvements to a CMOS PSD having a similar array construction to render it optimal for outdoor use.

A further review and teaching of multi-pixel PSDs using CMOS technology is found in Davies W. DeLimaMonteiro, et al., "Various Layouts of Analog CMOS Optical Position-Sensitive Detectors", SPIE Conference on Electronics for Solid State Sensors, SPIE Vol. 3794, pp. 134 (July 1999). This reference teaches the use of CMOS technologies to produce several array geometries and interconnections including an array of photodiodes in a chessboard-like structure.

DRPSD are generally implemented using an array of photosensors that are read out serially by metal oxide semiconductor field effect transistor (MOSFET) switches or a charge coupled device (CCD) as disclosed by F. Blais and M. Rioux, "Real-Time Numerical Peak Detector", Signal Processing, Vol. 11, No. 2, pp. 145–155 (1986). Since a DRPS samples the entire distribution, it can typically achieve higher accuracy levels than CRPSD, but at a slower speed relative to a CRPSD.

U.S. Pat. No. 6,297,488 to Beraldin et al. teaches a position sensitive light spot detector developed to improve the resolution and speed of a PSD. This detector includes a CRPSD (e.g., a lateral effect photodiode) for determining a first centroid of the light distribution and a DRPSD (e.g., a multiplexed array) for determining a second centroid of the light distribution within a reading window about the first centroid and within the light distribution. The second centroid represents the position of the light spot in the light distribution. Beraldin's multiple stage approach exploits the high resolution and speed offered by CRPSDs with the accuracy under variable lighting conditions offered by traditional DRPSDs.

The optical PSDs taught by the prior art can be used in many applications where remote, touch-free sensing and extremely high sensitivity are required. Some of these applications take advantage of a geometric leveraging effect to monitor mechanical devices. In accordance with this effect, the light beam is allowed to travel a large displacement across the face of the PSD in response to a small movement of the mechanical device being monitored. This approach allows the user to increase measurement sensitivity and decrease sensitivity to misalignments between the remote PSD and the mechanical device.

However, a high level of geometric leveraging creates a need for a large PSD. In addition, certain applications require that a large number of mechanical devices be monitored at the same time. Using a dedicated sensor for each device is extremely costly and not feasible or downright impossible due to physical constraints. It would be advantageous to resolve this problem by providing a single, large PSD having a sufficiently large bandwidth to sense a large number of multiplexed beams.

Unfortunately, the prior art technologies cannot be used for developing a large PSD with a sufficient bandwidth for monitoring a large number of parts. Specifically, in applications requiring a PSD as large as 50 mm×50 mm and a sampling rate of 25 MHz, even photodetectors built with CMOS are no longer fast enough. Thus, it would be a major improvement in the art to provide a single apparatus for monitoring the position of a large number of objects or mechanical parts while taking advantage of a high degree of geometric leveraging.

OBJECTS AND ADVANTAGES

In view of the shortcomings of the prior art, it is a primary object of the present invention to provide an apparatus for monitoring a large number of objects or mechanical parts simultaneously. The apparatus is to have a sufficiently large detection area, e.g., 50 mm×50 mm or more, to permit a high level of geometric leveraging. In particular, the apparatus should have sufficient bandwidth to track the centroids of spots produced by beams reflected from as many as 25 million objects or mechanical parts each second (25 MHz bandwidth). These and other objects and advantages will become apparent upon reading the following description.

SUMMARY

The objects and advantages are achieved by an apparatus for detecting a centroid of a spot produced by electromagnetic radiation, most commonly optic radiation in the visible wavelength range. In contrast to prior art devices, the present apparatus has an array of PIN photodiodes serving as photodetectors. The PIN photodiodes are organized in columns and in rows. Vertical connections are used to interconnect the PIN photodiodes in the columns in accordance with a first pattern that interconnects two or more adjacent columns. Horizontal connections are used to interconnect PIN photodiodes in the rows in accordance with a second pattern that interconnects two or more adjacent rows. The interconnections are made such that there are no anode connections between the PIN photodiodes in the rows and columns. The apparatus has a processing circuitry for deriving an X-extent of the centroid from current signals obtained from the columns and a Y-extent of the centroid from current signals obtained from the rows. In the preferred embodiment, the first and second patterns of interconnections preferably include just two adjacent columns and two adjacent rows, respectively and form a checkerboard interconnect pattern.

The apparatus operates on the principle that by interconnecting adjacent rows and columns of PIN photodiodes, e.g., in a checkerboard pattern, the resolution of the array is reduced only slightly but the processing electronics is reduced by half. That is because two interconnected adjacent columns yield only one current signal and two interconnected adjacent rows also yield just one current signal. Therefore, rather than four signals (two column signals and two row signals) only two current signals need to be analyzed by the processing circuitry.

The processing circuitry is equipped with appropriate multiplexing circuit for multiplexing a certain number of columns and rows. The processing circuitry has a discrimination circuit for selecting which rows and which columns should be examined based on the illumination level. Thus, for example, rows and columns registering negligible current signals and thus corresponding to a very low illumination level can be left out of consideration by the discrimination circuit.

In this embodiment, or in another embodiment, the processing circuitry is equipped with a logic for initially measuring the X- and Y-extents from all columns and rows, and measuring the X-coordinate and Y-coordinate of the centroid from only a selected number of columns and rows. Such initial measurement can be repeated periodically to ensure that only rows and columns, which yield current signals above a certain threshold level, are examined and used for deriving the X- and Y-coordinates of the centroid. The processing steps involved are performed by the processing circuitry and use of appropriate biasing.

In any of the above-mentioned embodiments, or in a still different embodiment the processing circuitry also has a calibration device for adjusting at least one detection characteristic of the PIN photodiodes. Dark leakage currents, forward voltage drops and other factors will typically condition the detection characteristics of the PIN photodiodes. It is also convenient to equip the apparatus with a filtering device such as a time-domain cross-talk filter or a weighted average noise compression filter to reduce the effects of noise on the determination of centroid position or X- and Y-extents.

In another embodiment or in any of the above-mentioned embodiments, the processing circuit can also be provided with a self-test circuit.

The arrangement of PIN photodiodes in the array requires a novel structure, wherein all the anode connections are made from one side and all the PIN photodiodes share one common cathode. The common cathode is provided on the backside of the apparatus facing the impinging electromagnetic radiation. The anode connections are made on the front side opposite the common cathode. A top cathode is also provided on the front side of the apparatus. Preferably, the top cathode is in the form of cathode rings surrounding the individual PIN diodes. The presence of the cathode rings will prevent undesirable inversion effects between the PIN photodiodes and collect the cathode current signal with as little series resistance as possible to ensure rapid operation.

The details of the apparatus and method of invention are explained in the detailed description with reference to the attached drawing figures.

DETAILED DESCRIPTION

Figure 1:
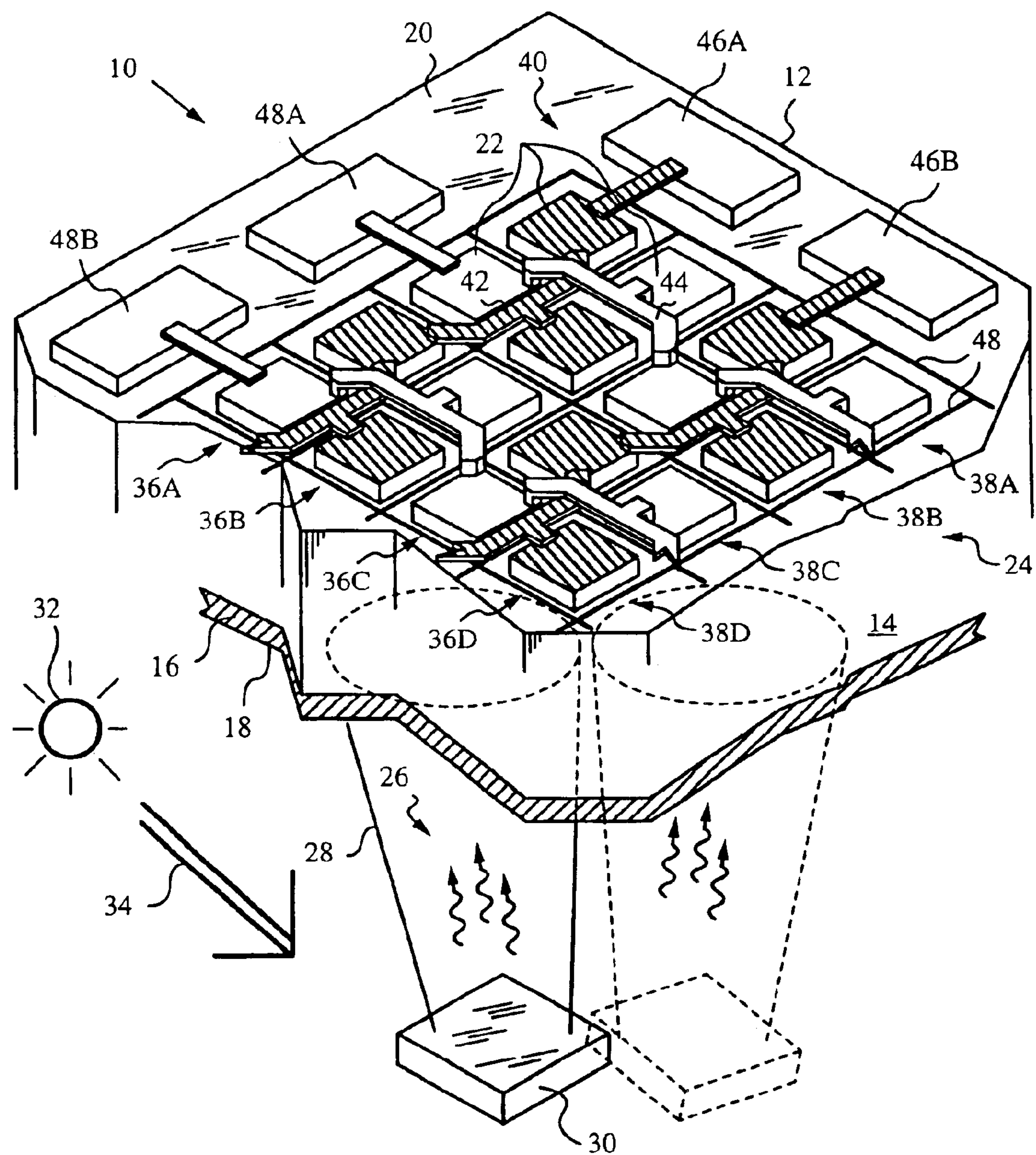
FIG. 1 is an isometric view illustrating the main features of a portion of an apparatus in accordance with the invention.

The invention will be best understood by initially referring to an isometric view of an edge portion of an apparatus 10, as shown in FIG. 1. Apparatus 10 is built up on a wafer 12 whose bulk is constituted by an N type intrinsic region 14. An $N^+$ type common cathode 16 is provided on a backside 18 of wafer 12. A front side 20 of wafer 12 has on it a number of $P^+$ type, square-shaped anode diffusion regions 22.

$P^+$ anode regions 22, intrinsic. N region 14 and $N^+$ common cathode 16 form a series of P-I-N structures or PIN photodiodes 24. The square-shaped anode diffusion regions 22 of PIN photodiodes 24 define the pixels of apparatus 10. PIN photodiodes 24 are thus the photo detecting devices of apparatus 10. Specifically, PIN photodiodes 24 generate current signals corresponding to the intensity of an electromagnetic radiation 26 striking the pixels, as described in more detail below.

In most applications, apparatus 10 is used to track, the movement of an object 30 such as a mechanical part. For this purpose a source 32 of radiation 26 is positioned to illuminate object 30 with an illuminating beam 34. Object 30 reflects a portion of radiation 26 in a reflected beam 28 directed at backside 18 of apparatus 10. The wavelength of radiation 26 making up illuminating beam 34 can be any suitable wavelength yielding sufficient reflection from object 30 and being detectable by PIN photodiodes 24. For example, the wavelength of radiation 26 can be in the range of visible light. It is also understood that any suitable optics (not shown) can be used to shape (e.g., collimate and/or focus) illuminating beam 34 on object 30.

PIN photodiodes 24 are arranged in a two-dimensional array 40 made up of a number of columns 36 and a number of rows 38. In the present figure only the first four PIN photodiodes 24 in four columns 36A–D and four rows 38A–D are shown. Vertical electric connections 42, indicated in by hatching for better visualization, interconnect several PIN photodiodes 24 in adjacent columns 36A and 36B in accordance with a first pattern. Analogously, several PIN photodiodes 24 are interconnected in accordance with the same pattern in the next two adjacent columns 36C, 36D. Photodiodes 24 which are interconnected by vertical connections 42 are indicated in hatched lines for better visualization of the first pattern. Horizontal electric connections 44 are used to interconnect PIN photodiodes 24 in adjacent rows 38A, 38B and in adjacent rows 38C, 38D in accordance with a second pattern. In the preferred embodiment, the first and second patterns of interconnections form a checkerboard interconnect pattern, as illustrated in FIG. 1.

Vertical and horizontal anode connections 42, 44 are made such that there are no anode connections between anodes 22 in columns 36 and rows 38. In order to ensure this, the conductors belonging to connections 42, 44 are electrically insulated from each other.

Bonding pads 46A, 46B and 48A, 48B are provided on topside 20 of wafer 12. Bonding pads 46A, 46B are connected to pairs of adjacent columns 36A, 36B and 36C, 36D that are interconnected by vertical connections 42. Thus, bonding pads 46A, 46B provide access to current signals generated by corresponding PIN photodiodes 24 in the pair of columns 36A, 36B and in the pair of columns 38C, 38D, respectively. Bonding pads 48A, 48B are connected to pairs of adjacent rows 38A, 38B and 38C, 38D interconnected by horizontal connections 44. Current signals generated by PIN photodiodes 24 in the pair of rows 38A, 38B are accessed via bonding pad 48A and current signals generated by PIN photodiodes 24 in the pair of rows 38C, 38D are accessed via bonding pad 48B. It should be noted that interconnecting adjacent columns 36 and rows 38 in pairs reduces the number of total signals to be processed by half. At the same time, the pairing of columns 36 and rows 38 reduces the resolution of apparatus 10. Thus, although more than two adjacent columns 36 or rows 38 can be interconnected in principle, in the preferred embodiment only pairs of adjacent columns and rows are interconnected in order not to unduly decrease the resolution of apparatus 10.

It should be noted that in accordance with the prior art PIN photodiodes are not usually arranged in two-dimensional arrays, as done in apparatus 10. In contrast, apparatus 10 not only positions PIN photodiodes 24 in two-dimensional array 40, but also provides for a novel interconnect architecture. Specifically, in order to function properly when receiving light 26 through back side 18 connections 42, 44 between PIN photodiodes 24 in columns 36 and rows 38 as well as connections to bonding pads 46, 48 are all made on topside 20 of wafer 12.

Figure 2:
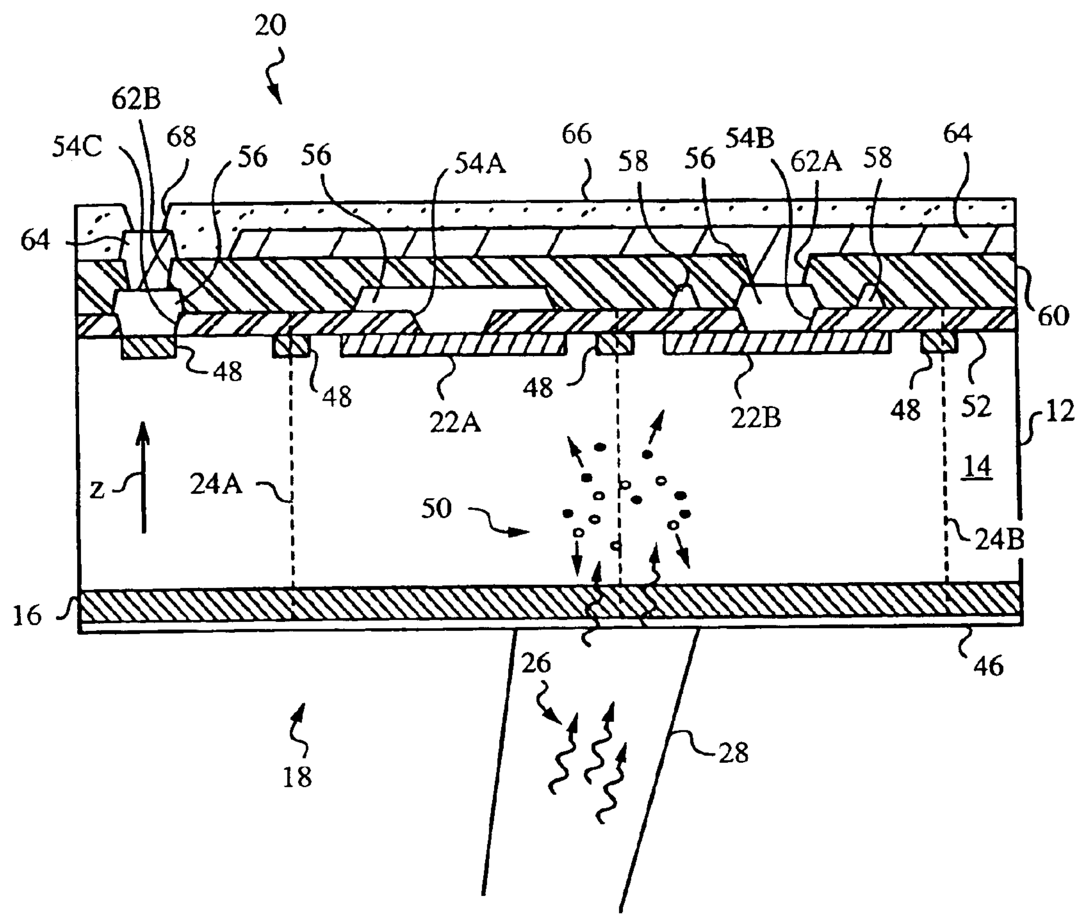
FIG. 2 is a cross sectional view of a portion of the apparatus of FIG. 1.

A particular architecture providing for the requisite interconnections on topside 20 is illustrated in a cross sectional view shown in FIG. 2. Corresponding parts from FIG. 1 are referenced by the same reference numbers in FIG. 2. Anodes 22 are produced by $P^+$ diffusions in topside 20 of wafer 12 in accordance with any suitable technique. In FIG. 2 only PIN photodiodes 24A, 24B and their anodes 22A, 22B are shown. Common cathode 16 is produced by $N^+$ diffusion of backside 18 by employing any suitable ion implanting method.

In addition to common cathode 16, $N^+$ diffusions 48 in the form of ring cathodes (see also FIG. 1) are provided in topside 20 around anodes 22 of individual PIN photodiodes 24. In other words, ring cathodes 48 are diffused in the areas between the pixels of apparatus 10. The purpose of ring cathodes 48 is to prevent inversion of the lightly doped silicon surface of wafer 12 between the pixels, as well as to collect the cathode current with as little series resistance as possible. As better illustrated in FIG. 1, cathode rings 48 form a continuous pattern across entire array 40.

An insulating oxide layer 52 covers topside 20. Vias or holes 54 are provided in oxide layer 52 for contacting anodes 22 and ring cathodes 48. Specifically, hole 54A is provided for contacting anode 22A belonging to PIN photodiode 24A and being located in one of columns 36 as shown in FIG. 1. Hole 54B is provided for contacting anode 22B belonging to PIN photodiode 24B and being located in one of rows 38 (see FIG. 1). Hole 54C is provided for contacting ring cathodes 48.

A first metal 56 deposited on top of oxide layer 52 is used in making both vertical connections 42 and horizontal connections 44. For that reason, metal 56 is plated through all holes 54 to establish electrical contact. In addition, first metal 56 is deposited on oxide layer 52 in the form of column lines 58.

An interlevel dielectric layer 60, e.g., an oxide layer, is used to cover first metal 56 with the exception of vias or holes 62. In particular, hole 62A is provided for establishing electrical contact with anode 22B of PIN photodiode 24B belonging to one of rows 38. Hole 62B provides access through dielectric layer 60 to ring cathodes 48. The connections to anode 22B and ring cathode 48 are made with a second metal 64 deposited on top of dielectric layer 52 and plated through holes 62 to contact with first metal 56.

Figure 3:
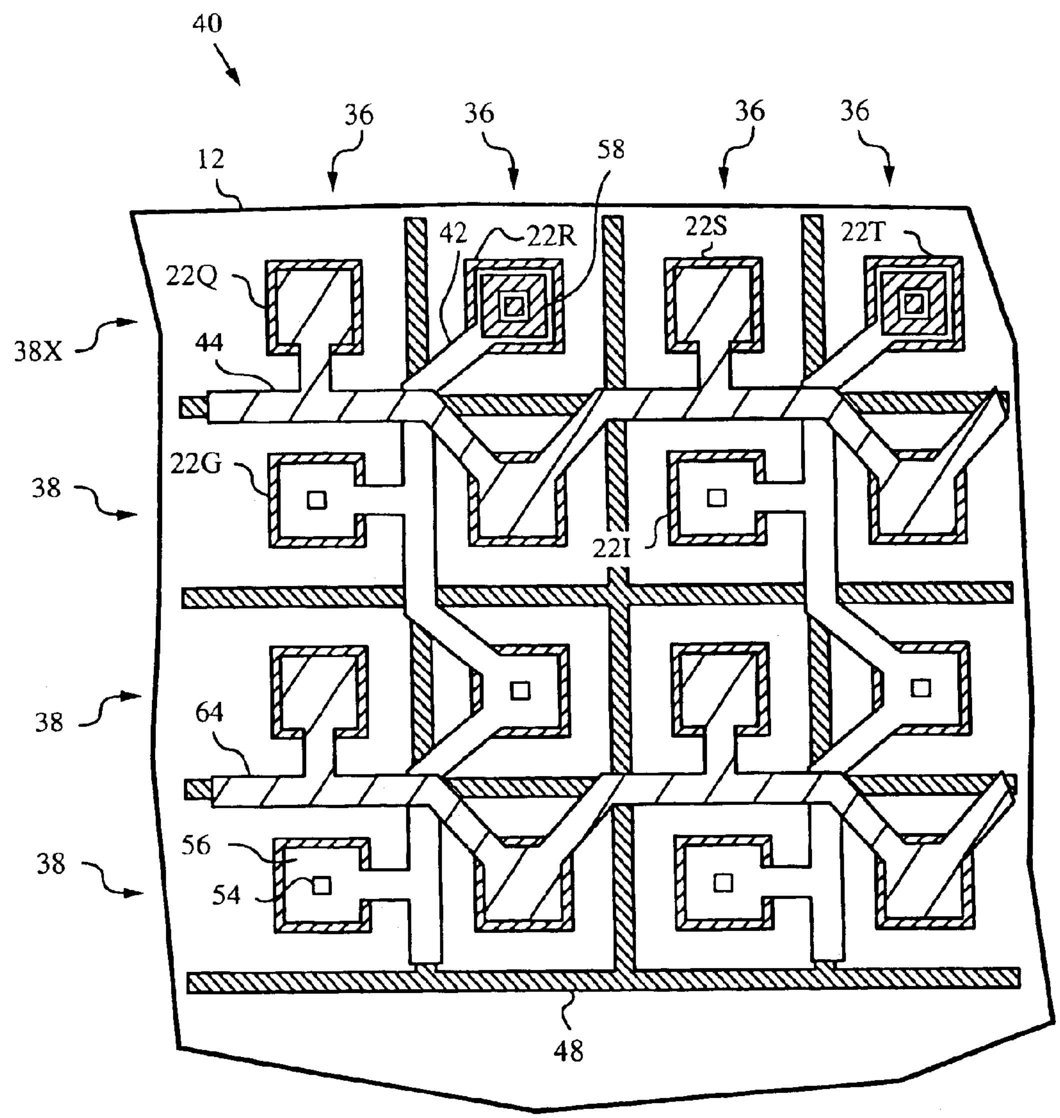
FIG. 3 is a top plan view of another portion of the apparatus of FIG. 1.

FIG. 3 illustrates in top plan view a portion of array 40 being built in accordance with the architecture shown in FIG. 2. To better visualize how first metal 56 and second metal 64 are deposited oxide layer 52 dielectric layer 60 are not shown. As discussed above, metal 56 is first deposited over all anodes 22 leaving traces 58 around plated vias 54 open for making horizontal connections 44 using second metal 64 or completing vertical connections 42 using first metal 56. Top row 36X illustrates anodes 22R, 22T plated with metal 56 in that manner. Anodes 22Q, 22S are already covered with metal 64 making horizontal connections 44. Anodes 22R, 22T belong to columns 36 and will be covered with first metal 56 just like anodes 22G, 22I in making vertical connections 42.

Referring back to FIG. 2, the present embodiment has an optional scratch protective layer 66 on top of second metal 64 and exposed areas of dielectric layer 60. A hole 68 is left open in protective layer 66 for accessing second metal 64 to form an electrical connection with ring cathodes 48. This connection can be made, e.g., by wire-bonding to pads (not shown) on top surface 20 of wafer 12 or by any other suitable technique. In addition, entire array 40 can be surrounded by an $N^+$ diffusion region 48' or cathode to which cathode rings 48 can be connected (see FIG. 4). The provision of common cathode 16 and ring cathodes 48 ensure a low impedance termination for applying any reverse bias potential to PIN photodiodes 24.

In the preferred embodiment, back side 18 has an antireflecting layer 46 disposed over common cathode 16. Antireflecting layer 46 is optional and is used to ensure that light 26 in reflected beam 28 is not scattered off back side 18. The thickness of intrinsic region 14 is small, e.g., on the order of 150 $\mu$m, in order to allow full depletion of PIN photodiodes 24 of array 40 at low applied voltage differences between anodes 22 and common cathode 16. Under these conditions, virtually all photons of light 26 falling in region 14 produce electron-hole pairs 50 that move to anodes 22 and cathode 16, as indicated by the arrows, thus producing current signals in PIN photodiodes 24A, 24B of the corresponding columns 36 and rows 38. Small thickness of region 14 is also beneficial because it reduces the transport delay of the electron hole pairs 50 along the z-direction.

Figure 4:
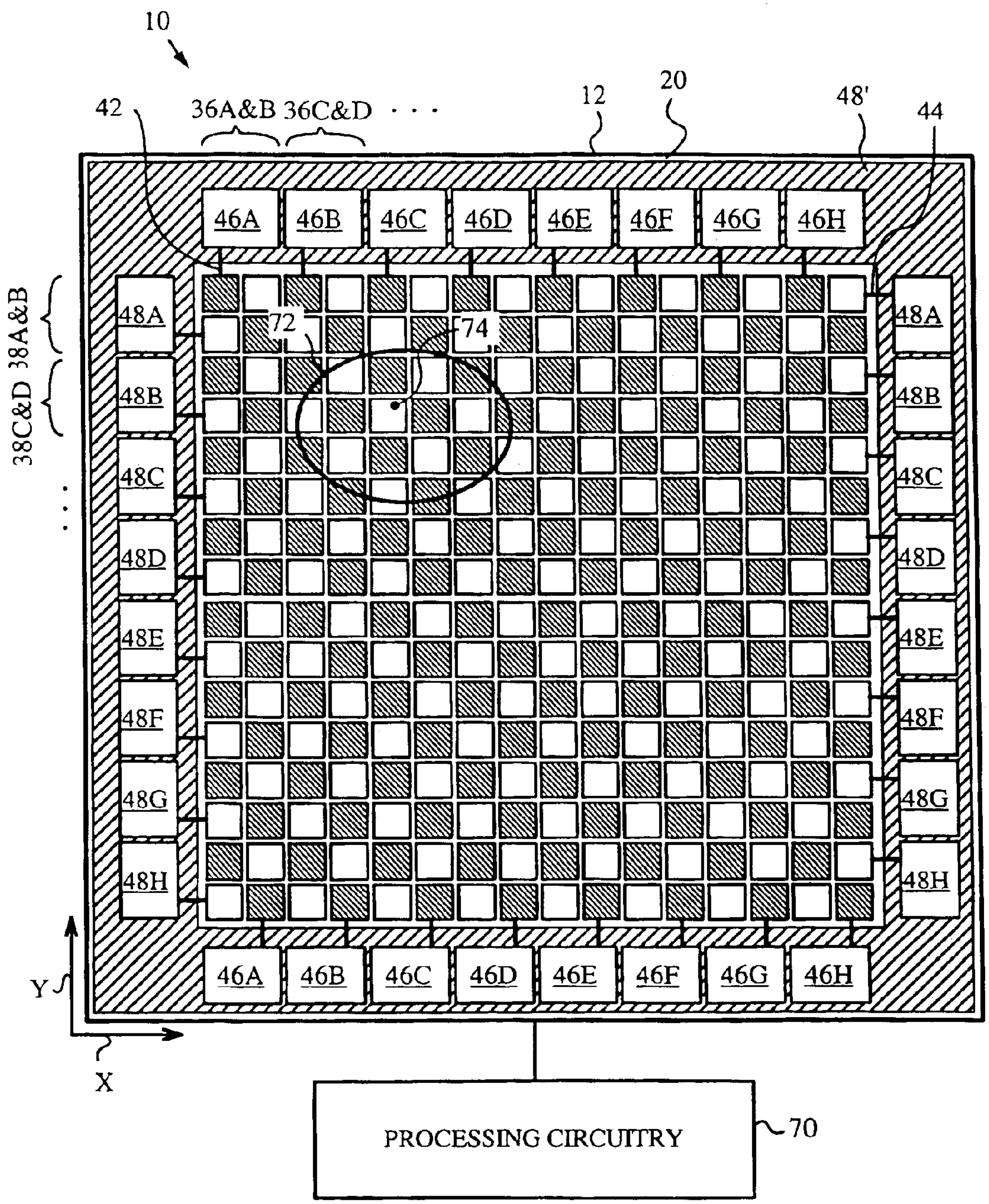
FIG. 4 is a top view of the apparatus of FIG. 1.

The operating principles will be best understood by referring to FIG. 4, which illustrates a top plan view of entire apparatus 10 in which array 40 contains 16×16 pixels made up of PIN photodiodes 24. It is understood that array 40 can be much larger, e.g., on the order of 1,024×1,024 pixels or even more. Vertical and horizontal connections 42, 44 between individual pixels are not shown for reasons of clarity. Instead, hatchings and brackets are used to indicate which pixels are connected in pairs of columns 36 and rows 38.

For better operation, the portion of top side 20 of wafer 12 which is not part of array 40 is provided with $N^+$ diffusion region 48' that is connected to cathode rings 48. The fill factor of pixels in array 40 should be as large as possible, e.g., 90% or more, to ensure efficient detection of light 26 in reflected beam 28. Bonding pads 46 and 48 are doubled in order to make the pairs of columns 36 and rows 38 accessible from either side. Preferably, the areas under bonding pads 46, 48 are not provided with $N^+$ diffusion region 48' in order to avoid stress cracks. Also, the thickness of oxide layer 52 under bonding pads 46, 48 should be as large as possible to ensure good mechanical properties and electrical insulation from region 14 (see FIG. 2).

Apparatus 10 has a processing circuitry 70 connected to array 40 via bonding pads 46, 48 in accordance with any suitable technique, e.g., wire bonding. Processing circuitry 70 is also connected to common cathode 16, as well as ring cathodes 48 and region 48 via holes 62 to provide ground voltage and/or appropriate biasing voltages to them.

As mentioned above, apparatus 10 operates on the principle that by interconnecting adjacent columns 36 and rows 38 in a checkerboard pattern the resolution of the array 40 is reduced slightly, but the processing electronics is cut in half. That is because pairs of interconnected adjacent columns 36 yield only one current signal per pair and pairs interconnected adjacent rows 38 also yield just one current signal per pair. Therefore, only half as many current signals need to be analyzed by processing circuitry 70 to detect a centroid 74 of a spot 72 produced by radiation 26 of reflected beam 28. More specifically, circuitry 70 derives an X-extent of where centroid 74 is to be found from current signals obtained from pairs of columns 36 and a Y-extent of where centroid 74 is to be found from current signals obtained from pairs of rows 38. (The X- and Y-directions are indicated by the X and Y coordinate axes.) The actual X- and Y-coordinates of centroid 74 are measured from the columns 36 and rows 38 within the X- and Y-extents. Thus, a small reduction in resolution is made to measure centroid 74 with less electronics.

Figure 5:
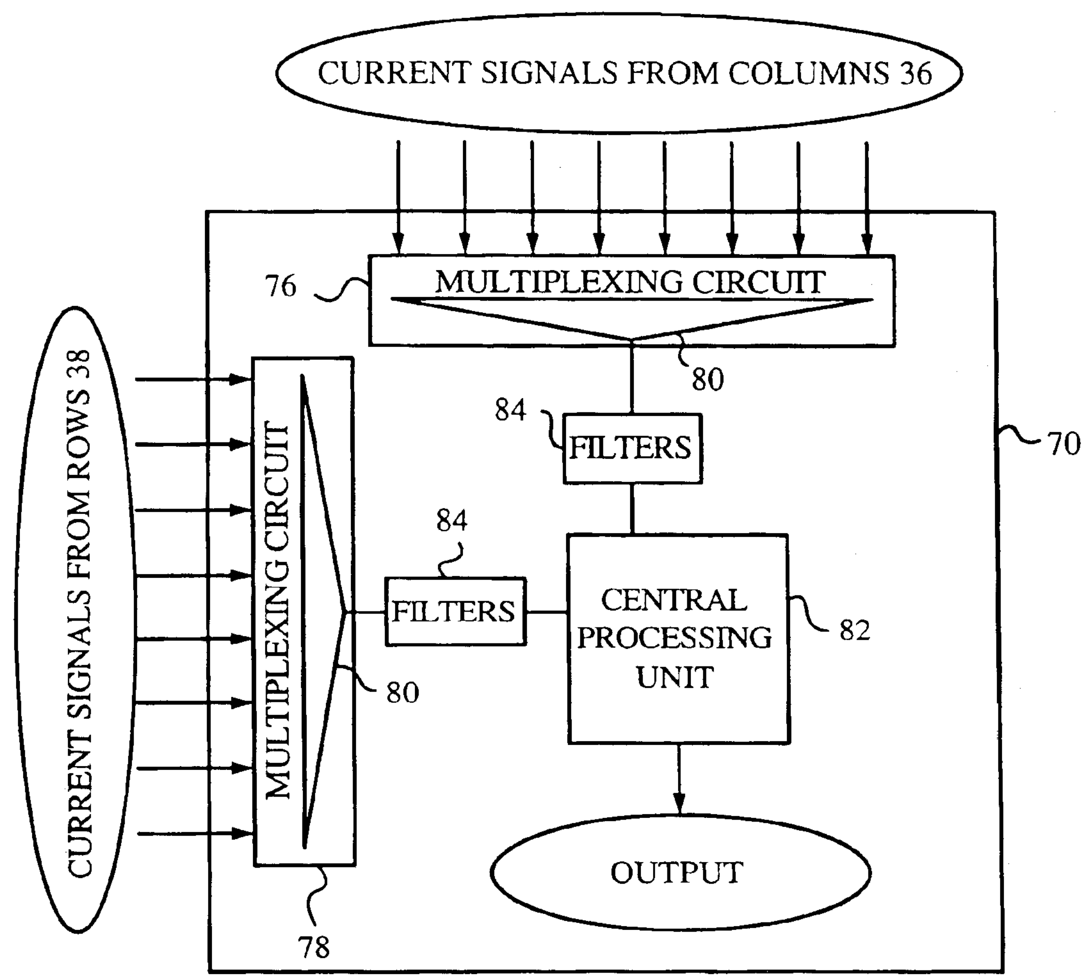
FIG. 5 is a general block circuit diagram illustrating exemplary circuitry for processing current signals in the apparatus of FIG. 1.

Circuitry 70 preferably calculates the X- and Y-extent of centroid 74 as well as total power delivered by light 26. FIG. 5 illustrates the components of circuitry 70 for performing these calculations. In particular, current signals from pairs of columns 36 are supplied to a multiplexing circuit 76. Meanwhile, current signals from pairs of rows 38 are supplied to a multiplexing circuit 78. Multiplexing circuits 76, 78 can multiplex signals from a certain number of columns 36 and rows 38. Preferably, multiplexing circuits have discrimination circuits 80 for selecting which pairs of columns 36 and rows 38 define the X- and Y-extents and are to be processed further based on illumination level or signal level to obtain the X- and Y-coordinates of centroid 74. Any suitable thresholding technique known in the art can be applied in performing this discrimination.

Processing circuitry 70 is equipped with a logic 82, in this case residing in a central processing unit, for measuring the X- and Y-extents from columns 36 and rows 38, and determining the X- and Y-coordinates from only the selected columns 36 and rows 38. Processing circuitry 70 also has a calibration device integrated with CPU 82 for adjusting one or more detection characteristics of PIN photodiodes 24. Dark leakage currents, forward voltage drops and other factors will typically condition the detection characteristics of the PIN photodiodes 24. These are taken into account by CPU 82 and communicated to multiplexing circuits 76, 78 and discrimination circuits 80 in accordance to standard electronics techniques known in the art.

Conveniently, processing circuit 70 has filtering devices or filters 84 for pre-processing the current signals from columns 36 and rows 38. Filters 84 can include devices such as a time-domain cross-talk filters or weighted average noise compression filters to reduce the effects of noise on the determination of X- and Y-extents and ultimately X- and Y-coordinates of centroid 74. It is also convenient to provide processing circuit 70 with self-test logic or circuitry. In the present embodiment, the self-test logic is also integrated in CPU 82.

Figure 6:
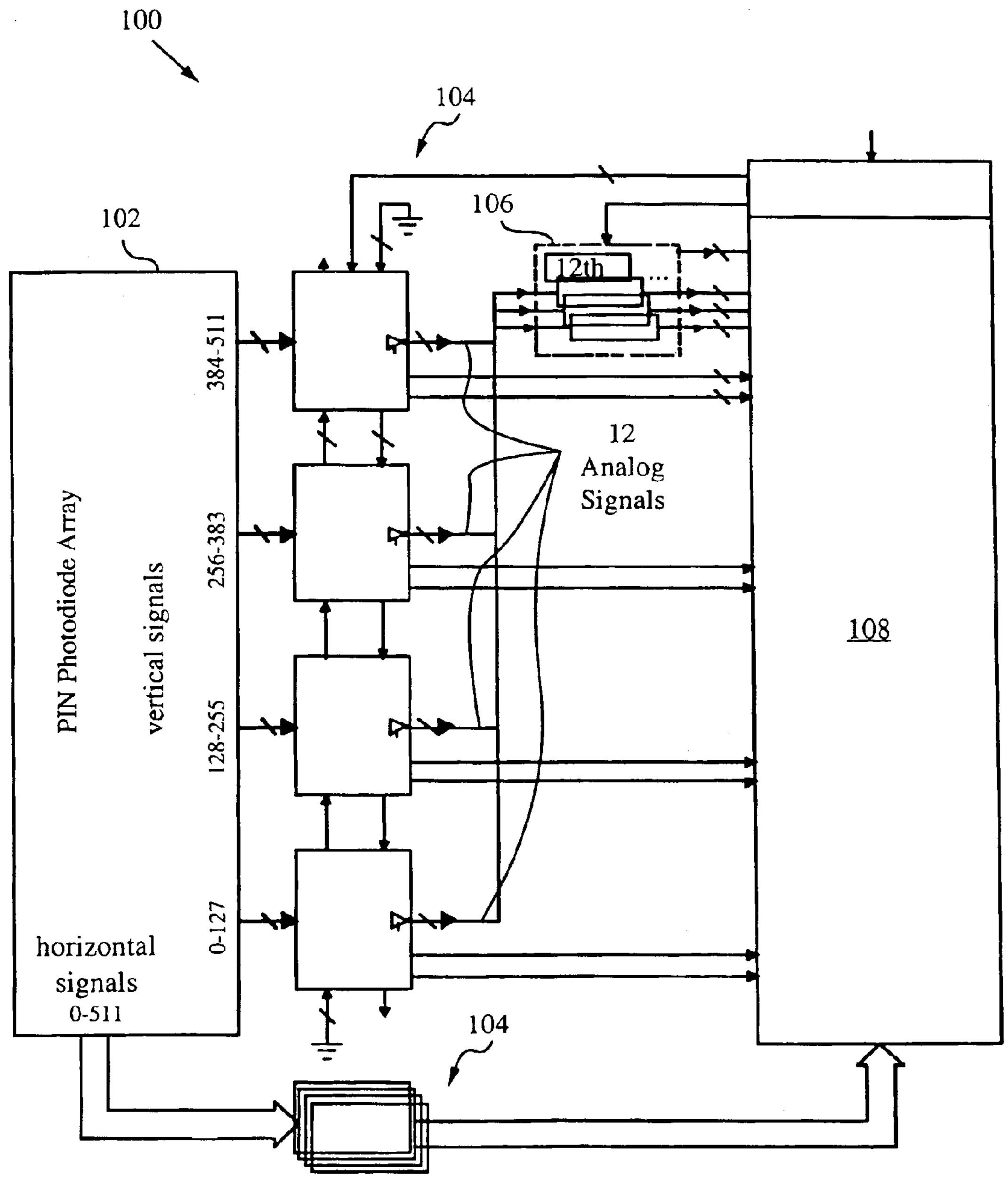
FIG. 6 is a block diagram of a processing circuitry for determining the centroid in an array of 1024×1024 PIN photodiodes.

A particular embodiment of a processing circuit 100 for determining X- and Y-coordinates of a centroid and calculating the total power output using a 1024×1024 PIN photodiode array (PDA) 102 in accordance with the invention is shown in FIG. 6. It is necessary to process 1024 current signals in order to produce these three outputs. A set of mixed-mode integrated circuits (IC) 104 is provided to pre-process the 1024 current signals from the columns and rows of PDA 102 and feed the processed signals to A/D converters 106 and digital logic 108 implemented in an field programmable gate array (FPGA). As shown, the 512 vertical signals corresponding to the rows are broken up into four groups of signals from rows 0–127, 128–255, 256–383, and 384–511. Likewise, the 512 horizontal signals are also broken up into four groups of signals (details not shown)

The job of mixed mode ICs 104 is to select the small number of rows and columns that are illuminated by the reflected position beam. For PDA 102 with row and column widths of 100 μm, a particular current output represents the number of photons collected over the 100 μm wide row or column. A beam width of, for example 500 μm will only cause current to flow in 5 of the 512 rows and 5 of the 512 columns. Mixed mode ICs 104 determine which of the 5 outputs are active. It then sends these outputs in a multiplexed format to the A/D converters 106, which output a digital value indicating which of the 5 out of 512 outputs have been selected. This digital value in effect provides coarse position information or the X-extent and the Y-extent. The A/D converters 106 provide the fine position information or the X- and Y-coordinates of the centroid.

FIG. 6 shows how PDA 102 is connected to mixed-mode ICs 104, the D/A converters 106, and FPGA 108. In practice, it is preferable to employ an algorithm that selects the rows (columns) that carry current results in sets of 12 rows (columns). In other words, each mixed-mode IC 104 outputs 12 analog signals corresponding to its assigned set of 12 rows or columns. There are therefore 12 A/D converters 106 for the rows and 12 A/D converters 106 for the columns.

In the present embodiment, the 512 rows are grouped together into groups of 4 rows for a total of 128 groups. The total current for a group is compared to a reference level. If there is only one group that has current above the reference level, then its four rows are sent in multiplexed format to the outputs and the 4 rows in each of the adjacent groups are sent in multiplexed format to the outputs as well. For a typical beam geometry, this guarantees that all of the photoelectric current is captured even if the beam is near the edge of the center group.

It is possible for the beam to be centered very near the edge of two groups. In this case, there may be two groups that have current levels above the reference level. In this situation, the eight rows associated with these groups are sent in multiplexed format to the outputs. Of the two adjacent groups to these selected two groups, the one that is adjacent to the selected group with the greatest current will be sent to the output in multiplexed format.

Figure 7:
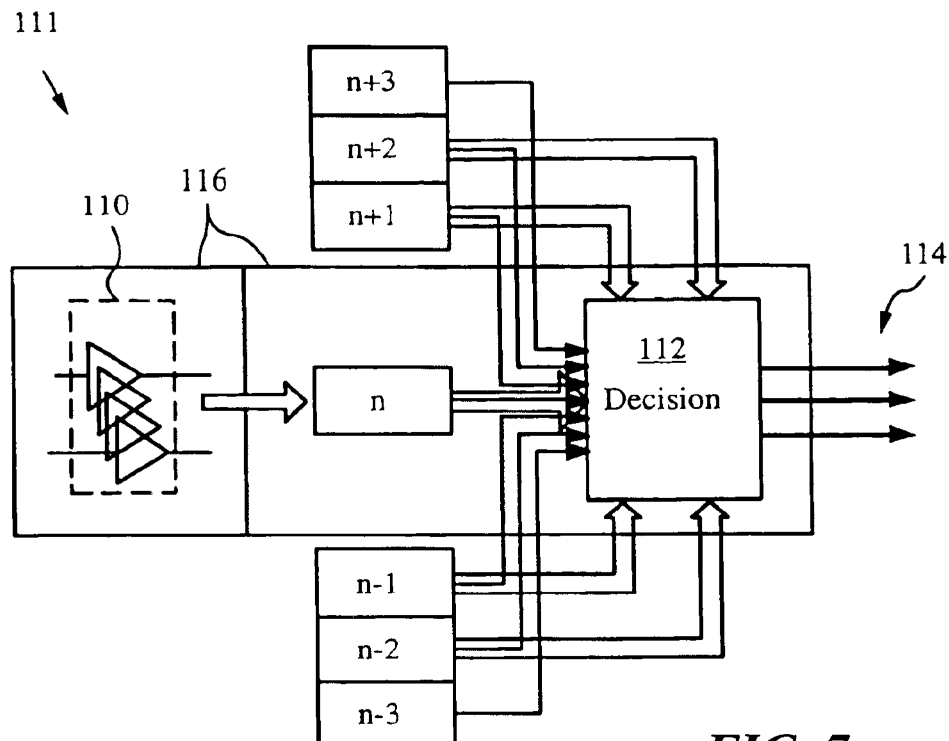
FIG. 7 is a block diagram illustrating the signal flow of a comparator for comparing the 4 row (column) groups.

FIG. 7 shows a comparator logic 111 and how it processes a group of 4 inputs with its neighboring groups to determine which 3 groups of 4 inputs will be sent in multiplexed format to the 12 outputs of the given mixed-mode IC 104. A rectangular box 116 indicates a single digital "channel". The wide arrows indicate count busses of 4 bits and the narrow arrows indicate N-bit lines. This logic employs 4 analog comparators 110 and a discrimination circuit 112 to determine which rows and columns to multiplex to outputs 114. By performing the comparison in this manner, it is possible to very rapidly make the selection and still guarantee that all of the photo-electric current has been captured.

Figure 8:
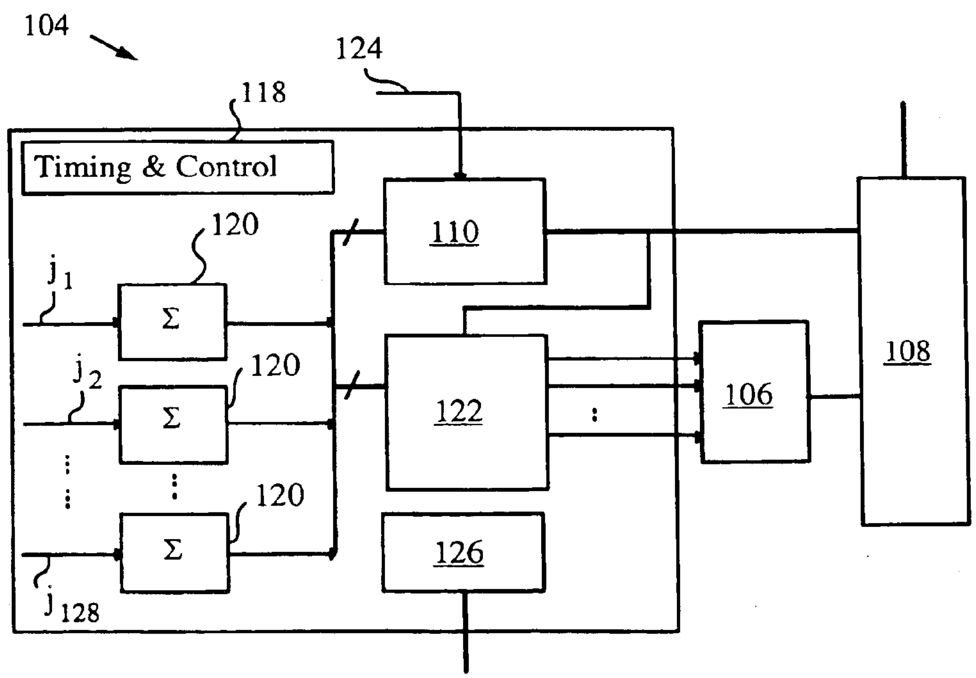
FIG. 8 is a block diagram of a current multiplexing mixed-mode IC.

FIG. 8 shows a block diagram of one current multiplexing mixed-mode IC 104. It should be remembered that 4 IC's 104 are required to handle the 512 inputs for one axis (i.e. the X or Y-axis). Each IC 104 processes 128 inputs arriving in the form of current signals $j_1$ through $j_{128}$. A timing and control circuit 118 provides the necessary timing and clock signals for processing current signals $j_1$ through $j_{128}$. The current from every input is integrated to a voltage by a capacitor in a corresponding input integrator 120. The integration period is 40 nsec to allow for 25 MHz operation. The voltage outputs from integrators 120 are fed into both comparator logic 111 for determining the X- and Y-extents and to multiplexers 122 for determining the X- and Y-coordinates. Comparator logic 111 determines, in accordance with the above-described grouping rules, which, if any, of the 128 inputs get multiplexed to the outputs and into the external A/D converters 106. In order to perform this function, IC 104 receives communications from other ICs 104 via connection 124 and sends its control signals to neighboring ICs 104 via interchip arbitration logic 126.

Figure 9:
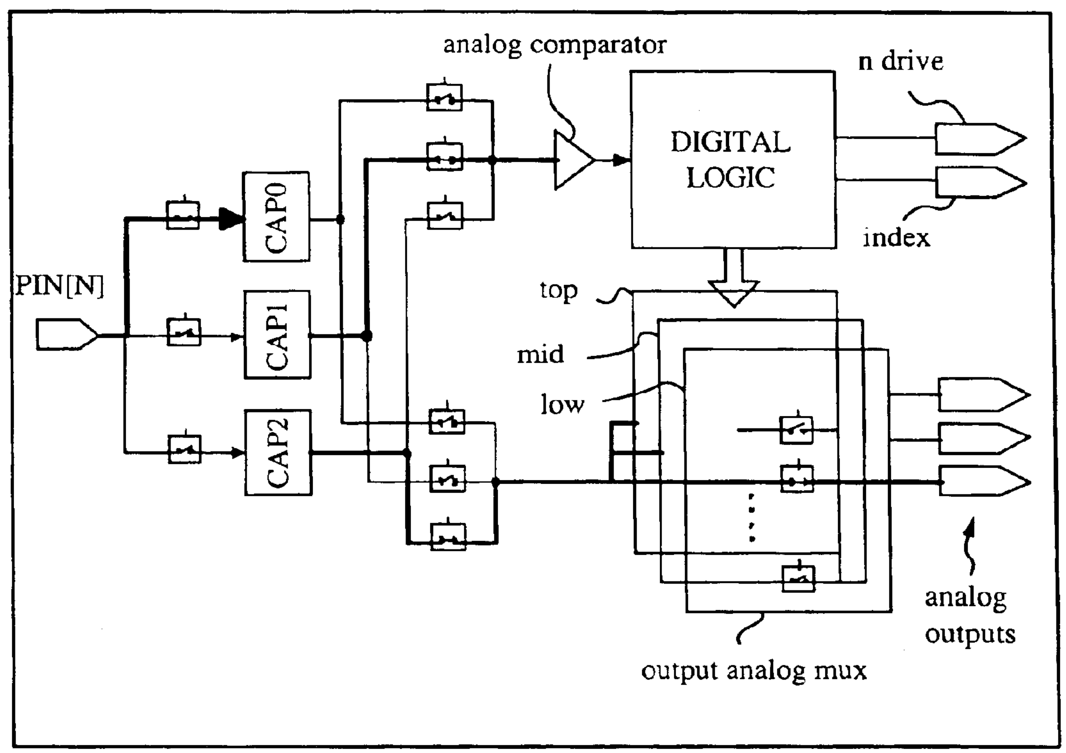
FIG. 9 is a functional format drawing of the processing logic for a PDA of 1024×1024 PIN photodiodes.

FIG. 9 illustrates the processing logic for processing PDA 102 in a more functional format drawing. A person skilled in the art will recognize that many specific circuit designs can be used to implement the processing logic.

Figure 10:
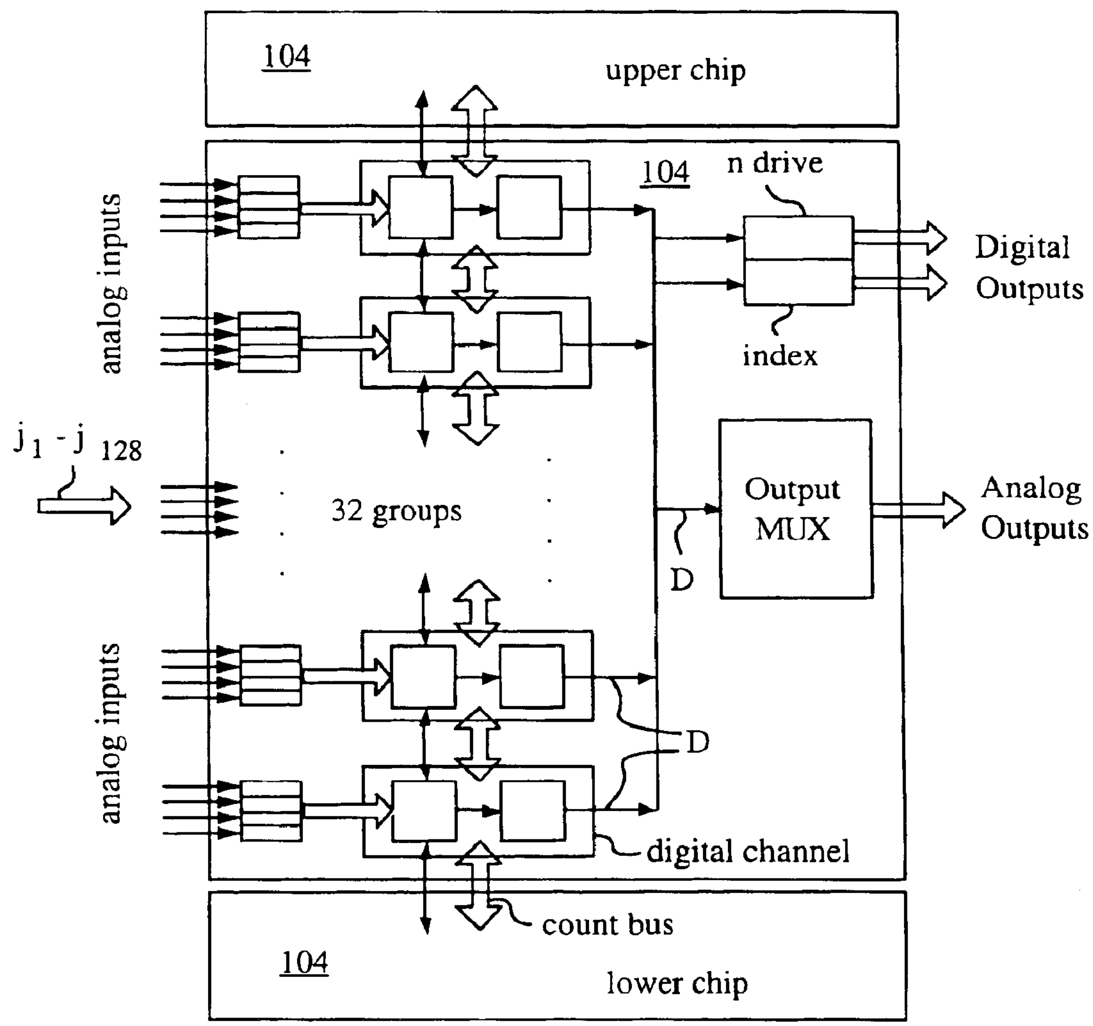
FIG. 10 illustrates the data flow between mixed-mode ICs.

Since it takes 4 ICs to process one axis, it is necessary for multiplexing ICs 104 to communicate with each other to determine which 12 integrators 120 (see FIG. 8) are the proper ones to multiplex to the outputs. Each IC 104 outputs the results of its comparator logic 111 to its physical neighbors and inputs the same data from its physical neighbors. This input data is evaluated with the local current inputs in determining which inputs get selected for multiplexing to the outputs. FIG. 10 shows how this data flows between ICs 104.

Figure 11:
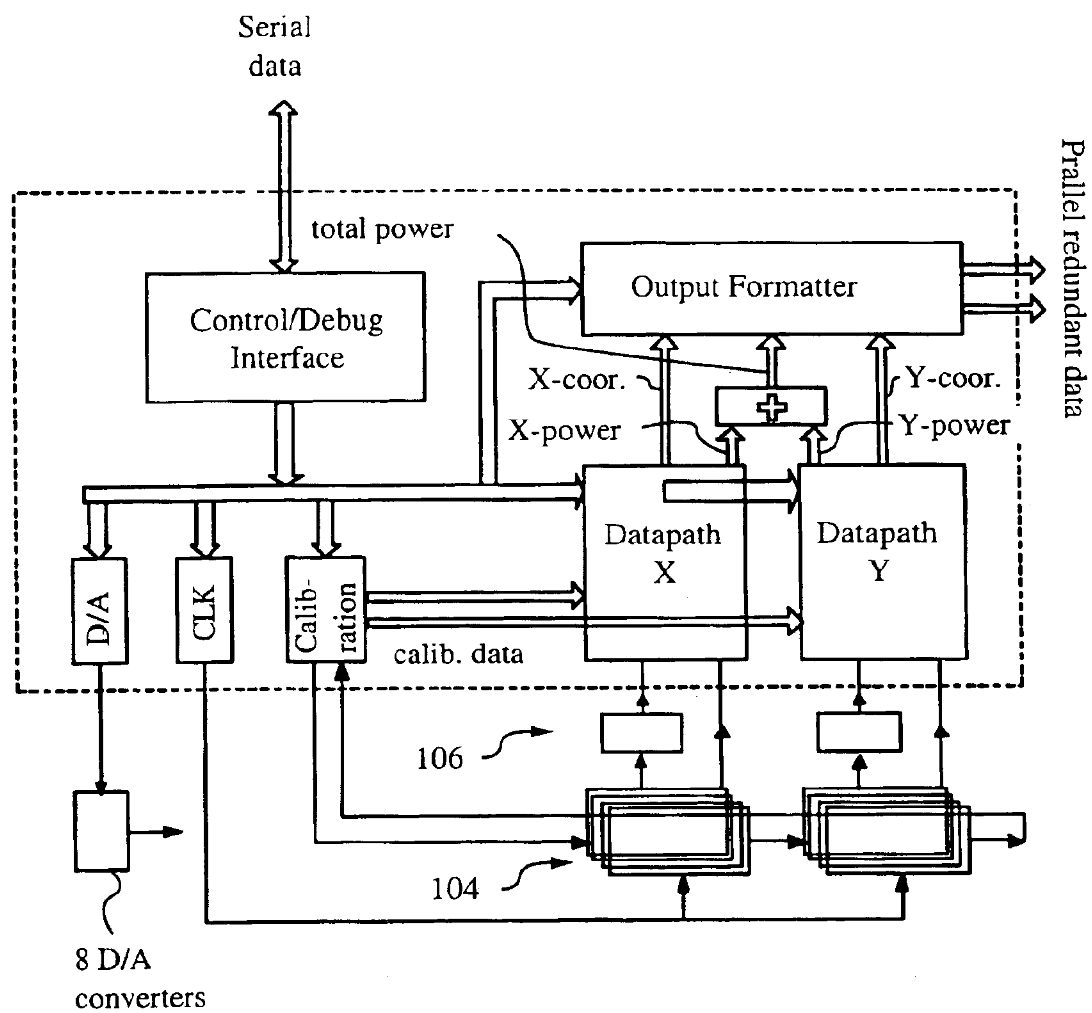
FIG. 11 is an FPGA logic array signal flow diagram.

Once the correct 12 inputs are selected for multiplexing to the outputs, these outputs are input to external analog to digital converters 106. These 12 ADCs 106 compute 12, 12-bit values and provide that data to FPGA logic array 108. Logic 108 performs a weighted average calculation of the current distribution and determines the X- and Y-coordinates of the centroid of the original light beam within the 12 rows (columns). Logic array 108 combines this information with the digital coarse address information, i.e., the X- and Y-extents from ICs 104 to determine where the centroid is with respect to all 512 rows (columns). FIG. 11 shows the signal path through external FPGA logic array 108.

Figure 12:
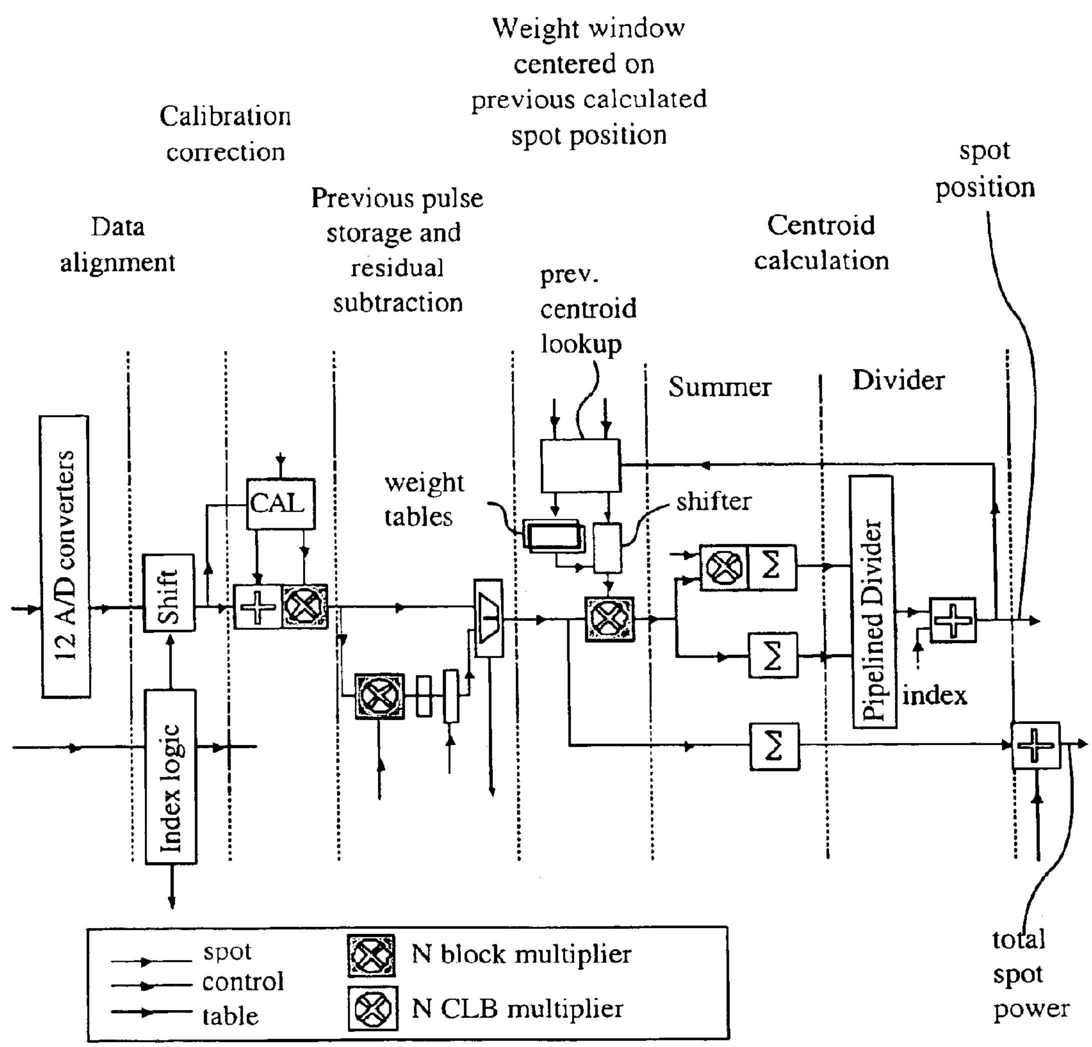
FIG. 12 illustrates the FPGA logic array computations.

The actual centroid calculation is based simply on the weighted average of the 12 current signals and the coarse group-select vector. The total power value is simply the sum of all of the vertical 12 current signals and the horizontal 12 current signals. However, there are more complicated corrections that need to be applied to the current signals before these final calculations are made. FIG. 12 symbolically shows how the inputs are processed as they go through FPGA logic array 108.

In practice it is advantageous to add several features to processing circuitry 100. For example, it is advantageous to include logic to correct for variations in IC gain stages biases and scale factors. For this purpose, a calibration cycle is inserted into the cycle after every set of laser spots has been processed. The results of this calibration cycle are fed into a calibration table. This data is used to correct for the bias and scale factor variations in each current signal.

The PDA is fast, but not all of the electron-hole pairs from a particular laser will make it to the current output before the next laser dot shines onto the PDA. This results in a potential cross talk problem if the two consecutive dots happen to fall in the same set of 12 current signals. To correct for this, the information from the previous laser dot is used to estimate the residual light cross talk. This estimation is subtracted from the current laser dot's current profile prior to computing its centroid and power level.

To reduce sensitivity to spurious noise, a noise compression algorithm is used. This algorithm uses the previous frames' information for the current laser dot to modify the weighted average of the 12 current signals. The center of the previous frame's position gets weighted more heavily than the other rows (columns). This reduces the ability of noise currents away from the center of the beam to cause the centroid calculation to shift in error.

A person skilled in the art will recognize that a large number of variations and alternatives fall within the scope of the present invention. Therefore, the extent of the invention should be judged by the scope of the appended claims and their legal equivalents.

What is claimed is:

1. An apparatus, comprising:

an array of PIN photodiodes arranged in columns and rows on which electromagnetic radiation is to be directed producing a spot having a centroid;

vertical connections to interconnect the PIN photodiodes in the columns in a first pattern interconnecting at least two adjacent columns;

horizontal connections to interconnect the PIN photodiodes in the rows in a second pattern interconnecting at least two adjacent rows without an anode connection between the rows and columns; and processing circuitry coupled to the array of PIN photodiodes to derive an X-extent of the centroid from the columns and a Y-extent of the centroid from the rows.

2. The apparatus of claim 1 wherein the first and second patterns are arranged in a checkerboard interconnection pattern.

3. The apparatus of claim 2 wherein the processing circuitry includes a multiplexing circuit to multiplex a number of the columns and of the rows.

4. The apparatus of claim 3 wherein the processing circuitry further includes a discrimination circuit to select the number of the columns and of the rows according to an illumination level.

5. The apparatus of claim 4 wherein the processing circuitry further includes a logic to measure the X-extent and the Y-extent from the columns and the rows and then to determine an X-coordinate and a Y-coordinate of the centroid from the number of the columns and the rows.

6. The apparatus of claim 2 wherein the processing circuitry further includes a calibration circuit to adjust at least one detection characteristic of the PIN photodiodes.

7. The apparatus of claim 2 wherein the processing circuitry further includes a filter circuit.

8. The apparatus of claim 7 wherein the filter circuit includes one of a time-domain cross-talk filter and a weighted average noise compression filter.

9. The apparatus of claim 2 wherein the processing circuitry further includes a self-test circuit.

10. The apparatus of claim 2 wherein the PIN photodiodes share a common cathode.

11. The apparatus of claim 10 wherein the common cathode is disposed on a backside of the apparatus facing the electromagnetic radiation.

12. The apparatus of claim 11 wherein anode connections are made on a front side of the apparatus opposite the backside.

13. The apparatus of claim 12 further comprising a top cathode on the front side of the apparatus.

14. The apparatus of claim 13 wherein the top cathode includes cathode rings.

* * * * *